United States Patent
Lin et al.

(10) Patent No.: US 10,535,944 B2
(45) Date of Patent: Jan. 14, 2020

(54) ELECTRICAL CONNECTOR

(71) Applicant: LOTES CO., LTD, Keelung (TW)

(72) Inventors: Chin Chi Lin, Keelung (TW); Zuo Feng Jin, Keelung (TW)

(73) Assignee: LOTES CO., LTD, Keelung (TW)

( * ) Notice: Subject to any disclaimer, the term of this patent is extended or adjusted under 35 U.S.C. 154(b) by 22 days.

(21) Appl. No.: 15/916,441

(22) Filed: Mar. 9, 2018

(65) Prior Publication Data
US 2018/0301839 A1 Oct. 18, 2018

(30) Foreign Application Priority Data
Apr. 14, 2017 (CN) .......................... 2017 1 0243282

(51) Int. Cl.
H01R 12/52 (2011.01)
H01R 13/03 (2006.01)
H01R 13/24 (2006.01)
H01R 13/405 (2006.01)
H05K 7/10 (2006.01)
H01R 12/71 (2011.01)
H01R 12/73 (2011.01)
H01R 43/02 (2006.01)
H01R 107/00 (2006.01)

(52) U.S. Cl.
CPC ......... *H01R 13/2414* (2013.01); *H01R 12/52* (2013.01); *H01R 12/714* (2013.01); *H01R 12/732* (2013.01); *H01R 13/03* (2013.01); *H01R 13/405* (2013.01); *H05K 7/1061* (2013.01); *H01R 43/0256* (2013.01); *H01R 2107/00* (2013.01)

(58) Field of Classification Search
None
See application file for complete search history.

(56) References Cited

U.S. PATENT DOCUMENTS

2013/0267118 A1* 10/2013 Cai .................... H01R 13/6581
439/607.01

FOREIGN PATENT DOCUMENTS

| CN | 1082265 | C | | 4/2002 |
|---|---|---|---|---|
| CN | 2904356 | Y | | 5/2007 |
| CN | 2904389 | Y | * | 5/2007 |
| CN | 204517082 | U | * | 7/2015 |

OTHER PUBLICATIONS

CN204517082U—Machine translation (Year: 2015).*
CN2904356Y—Machine translation (Year: 2007).*
CN2904389y—Machine translation (Year: 2007).*

* cited by examiner

*Primary Examiner* — Haroon S. Sheikh
(74) *Attorney, Agent, or Firm* — Locke Lord LLP; Tim Tinkang Xia, Esq.

(57) ABSTRACT

An electrical connector includes a reinforcing plate, which is encapsulated by an insulating body by injection molding. Positioning structures are provided in terminal slots of the insulating body. The insulating body is made of an elastic insulating material. Multiple terminals are mounted on the positioning structures. Each metal terminal is provided with an upper contact portion and a lower contact portion. When the upper contact portions is in contact with a chip module, and the lower contact portions is in contact with a circuit board, each of the metal terminals interferes with an inner wall of the corresponding terminal slot, so as to solve the metal fatigue of the metal terminals and to ensure the strength of the metal terminals.

13 Claims, 10 Drawing Sheets

ELECTRICAL CONNECTOR

CROSS-REFERENCE TO RELATED PATENT APPLICATION

This non-provisional application claims priority to and the benefit of, pursuant to 35 U.S.C. § 119(a), patent application Serial No. CN201710243282.1 filed in China on Apr. 14, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector, in particular to an electrical connector with metal terminals arranged in an elastic insulating body.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Chinese patent application No. CN200620059085.1 discloses an electrical connector for connecting a chip module to a circuit board, including an insulating body, a plurality of rows of accommodating holes formed in the insulating body, and conductive bodies provided in the accommodating holes. Each conductive body includes an elastic body and a metal layer provided outside the elastic body. The metal layer is in electrical conduction with the chip module and the circuit board. However, the conductive body is an elastic body inside and is only coated with a thin metal layer. Compared with other structures of the electrical connector, the strength of the elastic body is insufficient, which cannot ensure the electrical connection between the chip module and the circuit board. Furthermore, the metal layer disposed outside the elastic body is relatively thin. When the elastic body is compressed, the metal layer will deform along with the deformation of the elastic body, and the metal layer is unevenly stressed. When the force is concentrated at a certain point of the metal layer, the point is likely to be punctured, so that the surrounding portion of the metal layer also breaks, causing disengagement of the metal layer from the elastic body. As a result, the chip module cannot be in good contact with the metal layer, and ultimately the electrical connector cannot work properly.

Therefore, a heretofore unaddressed need to design an improved electrical connector exists in the art to address the aforementioned deficiencies and inadequacies.

SUMMARY

The present invention is directed to provide an electrical connector with metal terminals provided in an elastic insulating body.

To achieve the foregoing objective, the present invention adopts the following technical solutions:

An electrical connector, configured to be electrically connected to a chip module, includes: a reinforcing plate penetratingly provided with at least one penetrating hole; an insulating body encapsulating the reinforcing plate by injection molding, and provided with at least one terminal slot corresponding to the at least one penetrating hole, wherein a positioning structure is provided in each of the at least one terminal slot, and the insulating body is made of an elastic insulating material; and a plurality of at least one metal terminal mounted on the positioning structure. An included angle between a central axis of each of the at least one metal terminal and a lower surface of the insulating body is greater than 45 degrees. Each of the at least one metal terminal has an upper contact portion exposed from an upper surface of the insulating body and a lower contact portion exposed from the lower surface of the insulating body. When the upper contact portion of each of the at least one metal terminal is in electrical contact with the chip module and the lower contact portion of each of the at least one metal terminal is in electrical contact with a circuit board, each of the at least one metal terminal interferes with an inner wall of a corresponding one of the terminal slots.

In certain embodiments, each of the at least one metal terminal is provided with an matching portion formed by shrinking inwardly at a middle portion thereof, and the matching portion matches with the positioning structure.

In certain embodiments, the positioning structure comprises a pair of protruding portions, and each pair of the protruding portions are staggered in a vertical direction.

In certain embodiments, the reinforcing plate has a plurality of penetrating holes, at least one filling hole is provided between two adjacent penetrating holes of the penetrating holes, and the at least one filling hole is filled with the elastic insulating material.

In certain embodiments, each of the at least one filling hole is smaller than each of the penetrating holes.

In certain embodiments, the elastic insulating material is silicon rubber.

In certain embodiments, at least one positioning hole is penetratingly provided around the insulating body, the circuit board is provided with a through hole corresponding to the at least one positioning hole, and a positioning post passes through the at least one positioning hole and extends into the through hole.

In certain embodiments, each of the at least one metal terminal is sheet-shaped, and each of the at least one metal terminals has a plate surface and a side edge.

In certain embodiments, the side edge presses the positioning structure and the inner wall of the corresponding terminal slot.

In certain embodiments, the plate surface presses the positioning structure and the inner wall of the corresponding terminal slot.

In certain embodiments, when the chip module is operated to press the metal terminals downward, the positioning structure and the inner walls of the terminal slots deform, and when the chip module is operated to move away from the metal terminals, the positioning structure and the inner walls of the terminal slots rebound to restore positions of the metal terminals.

In certain embodiments, at least one expansion slit is concavely formed on the upper surface and the lower surface of the insulating body.

In certain embodiments, at least one first fixing portion is provided on at least one side of the reinforcing plate, the circuit board is provided with at least one second fixing portion corresponding to the at least one first fixing portion, and the at least one first fixing portion is positioned on the at least one second fixing portion.

In certain embodiments, two first fixing portions are provided on the reinforcing plate, and two second fixing portions are provided on the circuit board, wherein: both of the two first fixing portions are of a dual-in-line (DIP) type, the two second fixing portions are openings penetrating through the circuit board, and the first fixing portions are inserted into the second fixing portions; or both of the first fixing portions are of a surface mounted technology (SMT) type, the second fixing portions are soldering pads, and the first fixing portions are flatly attached to the second fixing portions; or one of the two first fixing portions is of the DIP type, and the other of the two first fixing portions is of the SMT type, the first fixing portion of the DIP type is inserted into one of the second fixing portions in a shape of an opening, and the first fixing portion of the SMT type is flatly attached to the other of the second fixing portions in a shape of a soldering pad.

Compared with the related art, in the foregoing electrical connector, the reinforcing plate is encapsulated by the insulating material by injection molding to form the elastic insulating body. The overall structure of the electrical connector is reinforced by the reinforcing plate, and the metal terminals are mounted in the insulating body, so as to solve the metal fatigue of the metal terminals, to ensure the strength of the metal terminals, and to guarantee that the electrical connector can work properly.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
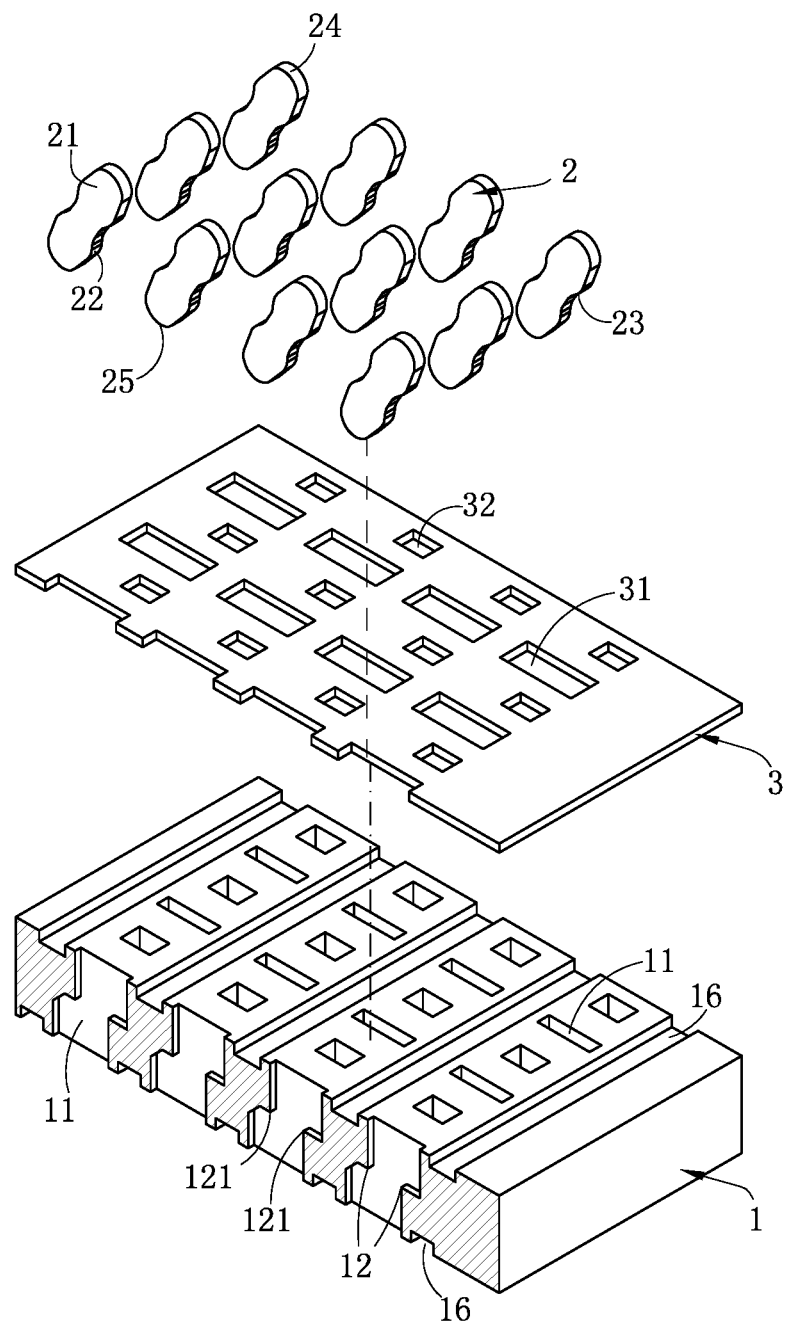
FIG. 1 is an exploded schematic view of an electrical connector according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-9. In accordance with the purposes of this invention, as embodied and broadly described herein, this invention, in one aspect, relates to an electrical connector.

Figure 2:
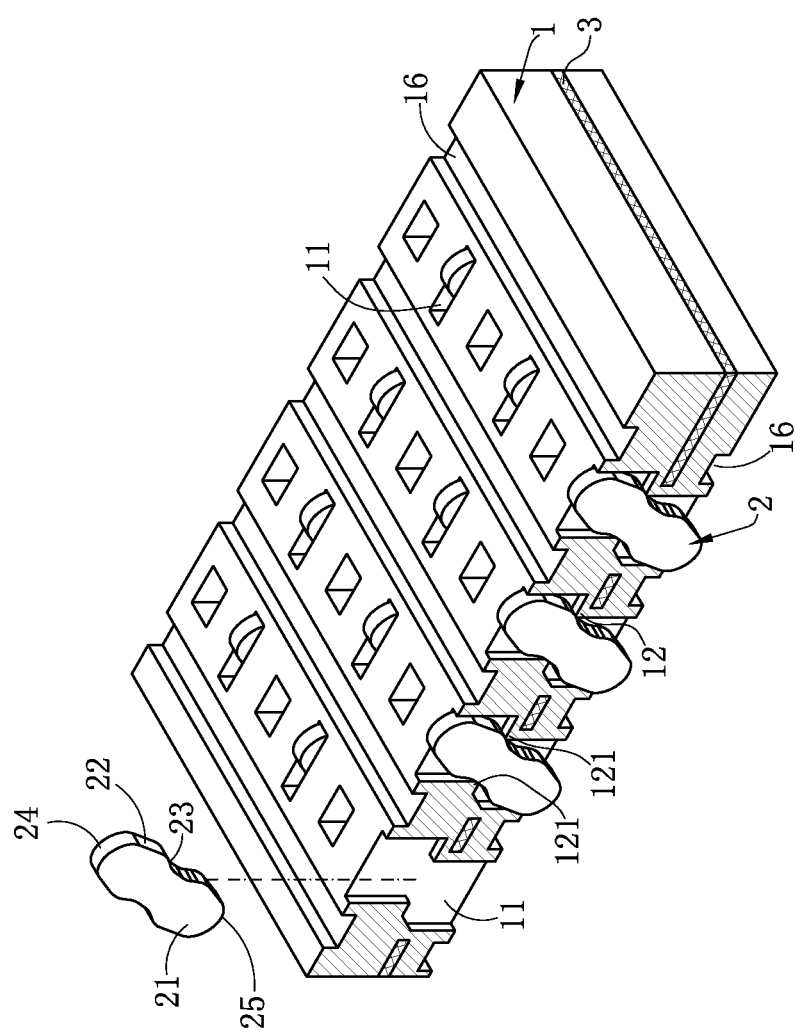
FIG. 2 is a schematic view of FIG. 1 after assembly.

As shown in FIG. 1 and FIG. 2, an electrical connector according to a first embodiment of the present invention includes an insulating body 1, a plurality of metal terminals 2 mounted in the insulating body 1, and a reinforcing plate 3, where the insulating body 1 is formed outside the reinforcing plate 3 by injection molding.

As shown in FIG. 1, FIG. 3, FIG. 4A and FIG. 4B, the insulating body 1 is made of silicone rubber and provided with a plurality of terminal slots 11. An inner wall of each terminal slot 11 is provided with a positioning structure 12. Each positioning structure 12 includes a pair of protruding portions 121, and each pair of the protruding portions 121 may be staggered in the vertical direction. An opening of each terminal slot 11 in the upper surface of the insulating body 1 and an opening of the terminal slot 11 in the lower surface of the insulating body 1 are staggered in the horizontal direction. Positioning holes 13 are penetratingly provided around the insulating body 1. A circuit board 200 is provided with through holes 201 corresponding to the positioning holes 13. Multiple positioning posts 14 are provided. Each of the positioning posts 14 has a post body 141, and each of the upper end and the lower end of the post body 141 is provided with a post head 142. The post body 141 passes through the corresponding positioning hole 13, and the post body 141 abuts the circuit board 200. A length of the post body 141 is greater than a thickness of the insulating body 1. The side surface of the post body 141 abuts the insulating body 1 in the corresponding positioning hole 13. Due to the elasticity of the silicone rubber, the insulating body 1 applies an elastic force to the post body 141 to fix the post body 141 in the corresponding positioning hole 13 and prevent the post body 141 from swaying in the positioning hole 13. The post heads 142 extend into the through holes 201, and the post heads 142 do not protrude outward from the circuit board 200. The positioning posts 14 pass through the positioning holes 13 and the through holes 201 to fix the electrical connector at a position corresponding to the circuit board 200, so that the electrical connector and the circuit board 200 can be accurately soldered together. Multiple expansion slits 16 are concavely formed on the upper surface and the lower surface of the insulating body 1. The expansion slits 16 on the upper surface of the insulating body 1 and the expansion slits 16 on the lower surface of the insulating body 1 are staggered in the horizontal direction. The expansion slits 16 and the terminal slots 11 are alternately arranged. The expansion slits 16 run through two side surfaces of the insulating body 1. A width of the expansion slits 16 is smaller than a width of the terminal slots 11. In other embodiments, the expansion slits 16 may be provided not to run through the two side surfaces of the insulating body 1 so that the expansion slits 16 stop at the side surfaces of the insulating body 1.

Figure 4A:
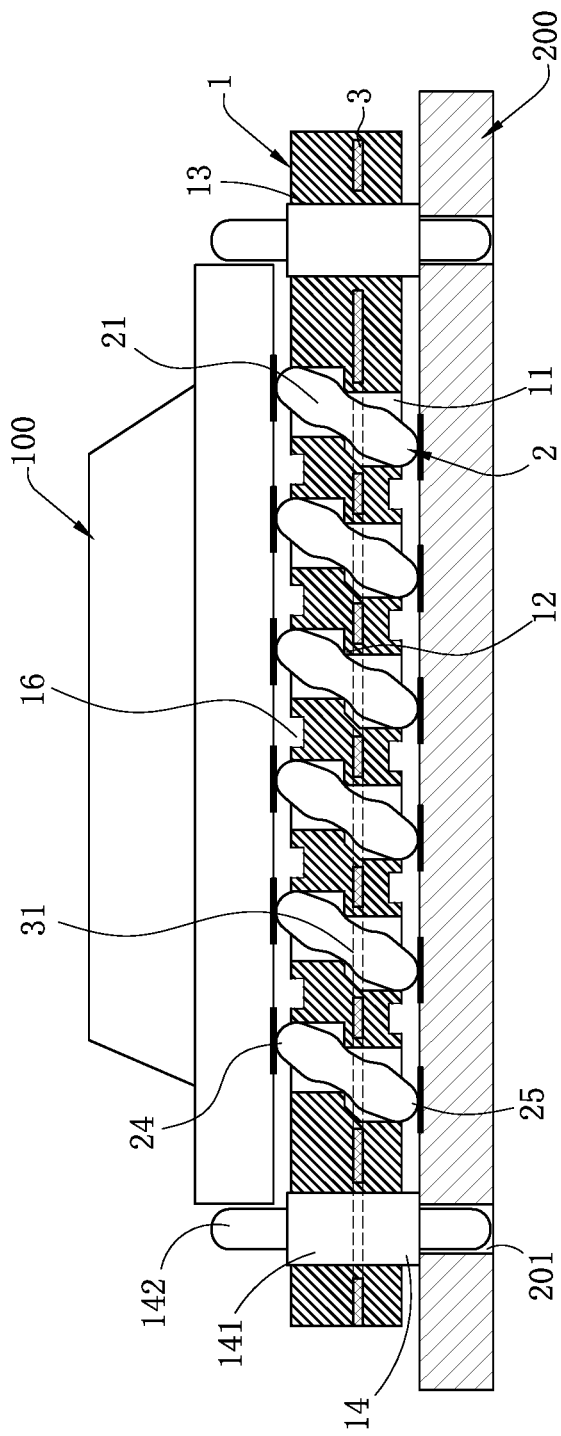
FIG. 4A is a schematic view of the electrical connector mounted on a chip module according to the first embodiment of the present invention, where the chip module is placed on the electrical connector.
Figure 4B:
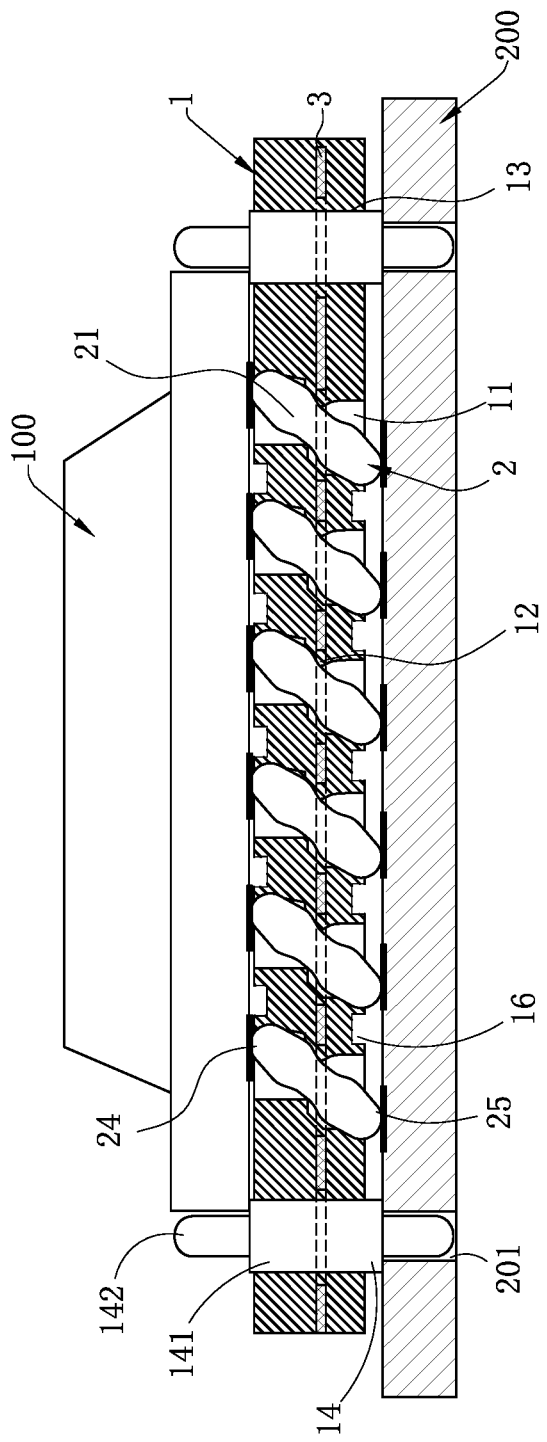
FIG. 4B is a schematic view of the electrical connector mounted on a chip module according to the first embodiment of the present invention, where the chip module is pressed toward the metal terminals.

As shown in FIG. 4A and FIG. 4B, multiple positioning hole 13 are provided around the insulating body 1. In this case, the circuit board 200 is correspondingly provided with multiple through holes 201, and multiple positioning posts 14 are provided. In other embodiments, it is also feasible that only one positioning hole 13 is provided around the insulating body 1. In this case, correspondingly, the circuit board 200 may be provided with one through hole 201, and only one positioning post 14 is needed.

As shown in FIG. 2, FIG. 3, FIG. 4A and FIG. 4B, the metal terminals 2 are sheet-shaped terminals mounted on the positioning structures 12. The metal terminals 2 interfere with the inner walls of the terminal slots 11, and an included angle between a central axis of each metal terminal 2 and the lower surface of the insulating body 1 is greater than 45 degrees, so as to ensure that the compression force applied by the metal terminals 2 to the positioning structures 12 and the inner walls of the terminal slots 11 has multiple directions and multiple angles. The directions of the force include a vertically downward direction, an obliquely downward direction and a horizontal direction. Each metal terminal 2 has a plate surface 21 and a side edge 22. Each metal terminal 2 shrinks inward at a middle portion thereof to form an matching portion 23. Each matching portion 23 matches with the corresponding protruding portion 121. Each side edge 22 faces downward obliquely, and each side edge 22 presses the corresponding positioning structure 12 and the inner wall of the corresponding terminal slot 11. An upper contact portion 24 extends upward from each matching portion 23 and is exposed from the upper surface of the insulating body 1 to be electrically connected with a chip module 100. A lower contact portion 25 extends downward from each matching portion 23 and is exposed from the lower surface of the insulating body 1 to be electrically connected with the circuit board 200. The chip module 100 is located between the two post heads 142. A width of each of the lower contact portions 25 and the upper contact portions 24 is greater than a width of each matching portion 23.

As shown in FIG. 1, FIG. 3, FIG. 4A and FIG. 4B, the reinforcing plate 3 is formed in the insulating body 1 by injection molding. The reinforcing plate 3 is made of a metal material, and the reinforcing plate 3 is provided with a plurality of penetrating holes 31 corresponding to the terminal slots 11. The penetrating holes 31 are rectangular shaped, and the metal terminals 2 pass through the penetrating holes 31. At least one filling hole 32 is disposed between two adjacent penetrating holes 31, and the filling holes 32 are also rectangular shaped. The filling holes 32 penetrate through the reinforcing plate 3 vertically and are filled with an insulating material. The filling holes 32 are smaller than the penetrating holes 31, so that the strong connection between the reinforcing plate 3 and the insulating body 1 can be achieved without occupying too much area of the reinforcing plate 3. The filling holes 32 are located among the expansion slits 16.

As shown in FIG. 4A, the chip module 100 is operated to be placed on the electrical connector, and the position of the chip module 100 connected to the electrical connector is limited by the positioning posts 14, so that the chip module 100 and the corresponding metal terminals 2 can be correspondingly connected. A gap is left between the chip module 100 and each post body 141, and the metal terminals 2 are not significantly deformed. As shown in FIG. 4B, an external device (not shown) is operated to press the chip module 100 toward the metal terminals 2, and the metal terminals 2 press the protruding portions 121 and the inner walls of the terminal slots 11. Since the insulating body 1 is made of silicon rubber and the silicone rubber is an elastic material, the protruding portions 121 and the inner walls of the terminal slots 11 are deformed, and the contact area between the protruding portions 121 and the inner walls of the terminal slots 11 and the metal terminals 2 becomes larger. The chip module 100 abuts the post bodies 141, and the post bodies 141 limit the chip module 100 from moving downward excessively to damage the metal terminals 2. As shown in FIG. 4A, the chip module 100 is stopped from pressing the electrical connector downward. By utilizing the elasticity of the insulating body 1, the protruding portions 121 and the inner walls of the terminal slots 11 rebound to restore the positions of the metal terminals 2, and the metal terminals 2 support the chip module 100 higher so that the chip module 100 can be away from the post bodies 141. In addition, a gap is still left between the chip module 100 and each post body 141, so that the positioning posts 14 can move slightly in the vertical direction to prevent damage of the metal terminals 2 due to tight assembly between the chip module 100 and the electrical connector, and also to facilitate the separation of the chip module 100 from the electrical connector.

Figure 5:
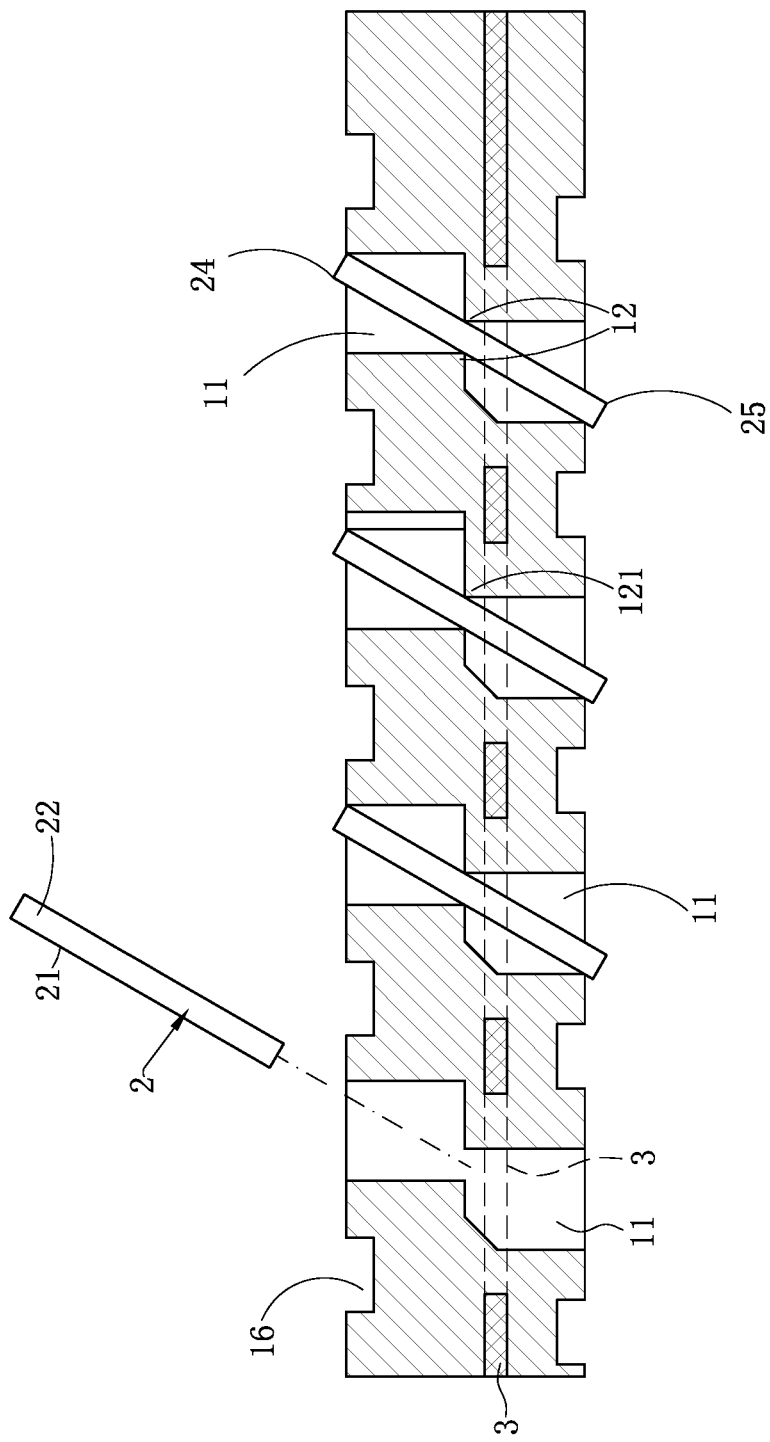
FIG. 5 is a schematic view of a second embodiment of the present invention.

FIG. 5 shows a second embodiment of the present invention. The differences of this embodiment from the first embodiment exist in that the insulating body 1 is provided outside the reinforcing plate 3 by injection molding. The insulating body 1 is provided with a plurality of terminal slots 11, and the positioning structures 12 are disposed on the inner wall of each terminal slot 11. Each metal terminal 2 is a sheet-shaped terminal and is mounted on the corresponding positioning structure 12. The included angle between the central axis of each metal terminal 2 and the lower surface of the insulating body 1 is greater than 45 degrees, and the metal terminals 2 interfere with the inner walls of the terminal slot 11. Each metal terminal 2 has a plate surface 21 and a side edge 22, and the plate surface 21 faces downward obliquely. Each plate surface 21 presses the corresponding positioning structure 12 and the inner wall of the corresponding terminal slot 11. An upper contact portion 24 is provided at the upper end of each plate surface 21, and the upper contact portion 24 is exposed from the upper surface of the insulating body 1 to be electrically connected with a chip module 100. A lower contact portion 25 is disposed at the lower end of each plate surface 21, and the lower contact portion 25 is exposed from the lower surface of the insulating body 1 to be electrically connected with a circuit board 200.

Figure 6:
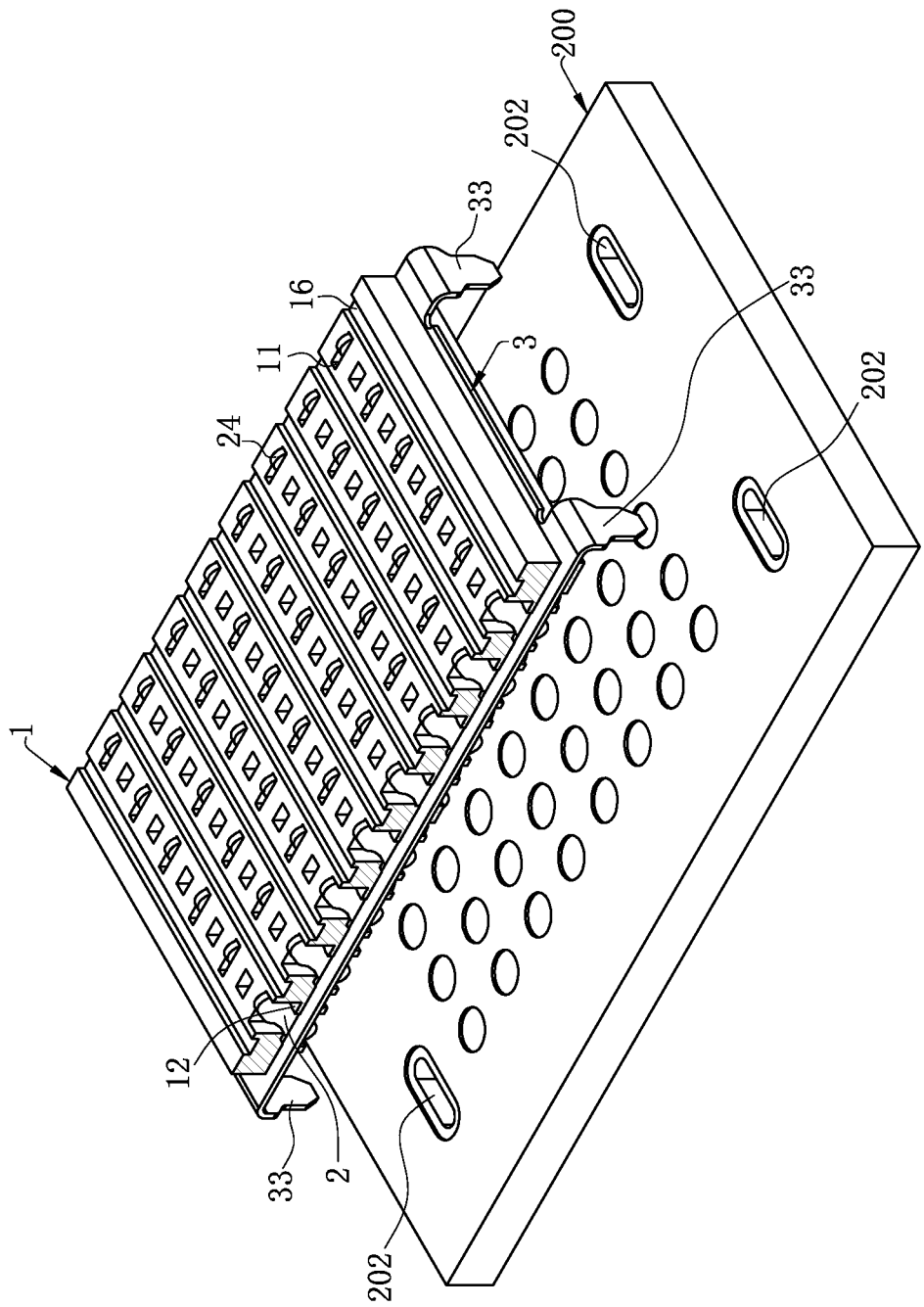
FIG. 6 is a schematic view of an electrical connector and a circuit board before fixation according to a third embodiment of the present invention.
Figure 7:
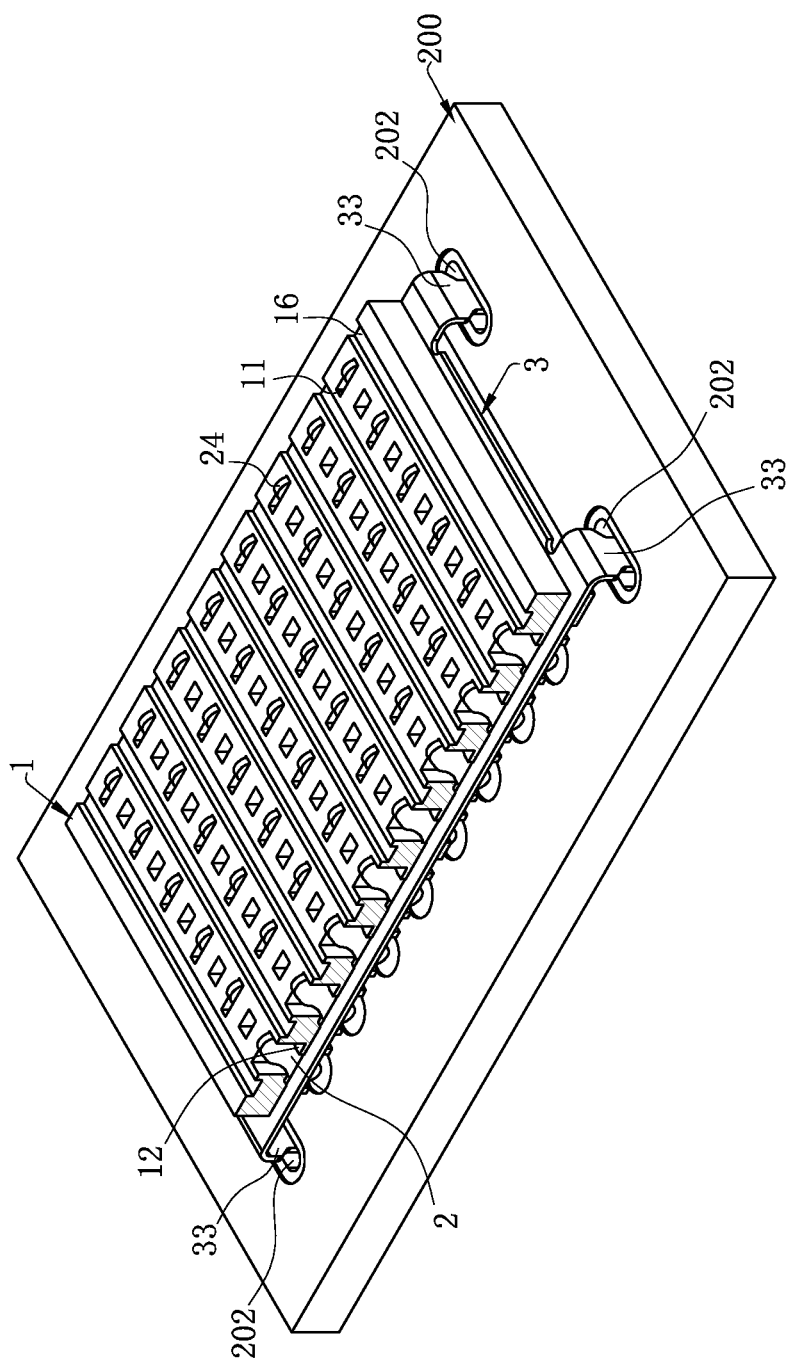
FIG. 7 is a schematic view of the electrical connector and the circuit board in FIG. 6 after fixation.

FIG. 6 and FIG. 7 show a third embodiment of the present invention. The differences of this embodiment from the first embodiment exist in that the way the electrical connector being fixed to the circuit board 200 is not by the positioning posts 14, the positioning holes 13 or the through holes 201. Instead, two first fixing portions 33 extend outward from the left side and the right side of the reinforcing plate 3 respectively. The left side and the right side of the circuit board 200 are provided with two second fixing portions 202 corresponding to the first fixing portions 33, and the first fixing portions 33 are positioned on the second fixing portions 202, so as to enable the electrical connector to be fixed on the circuit board 200. The first fixing portions 33 are both of a DIP type, the second fixing portions 202 are openings penetrating through the circuit board 200 vertically, and the first fixing portions 33 are inserted into the second fixing portions 202.

Figure 8:
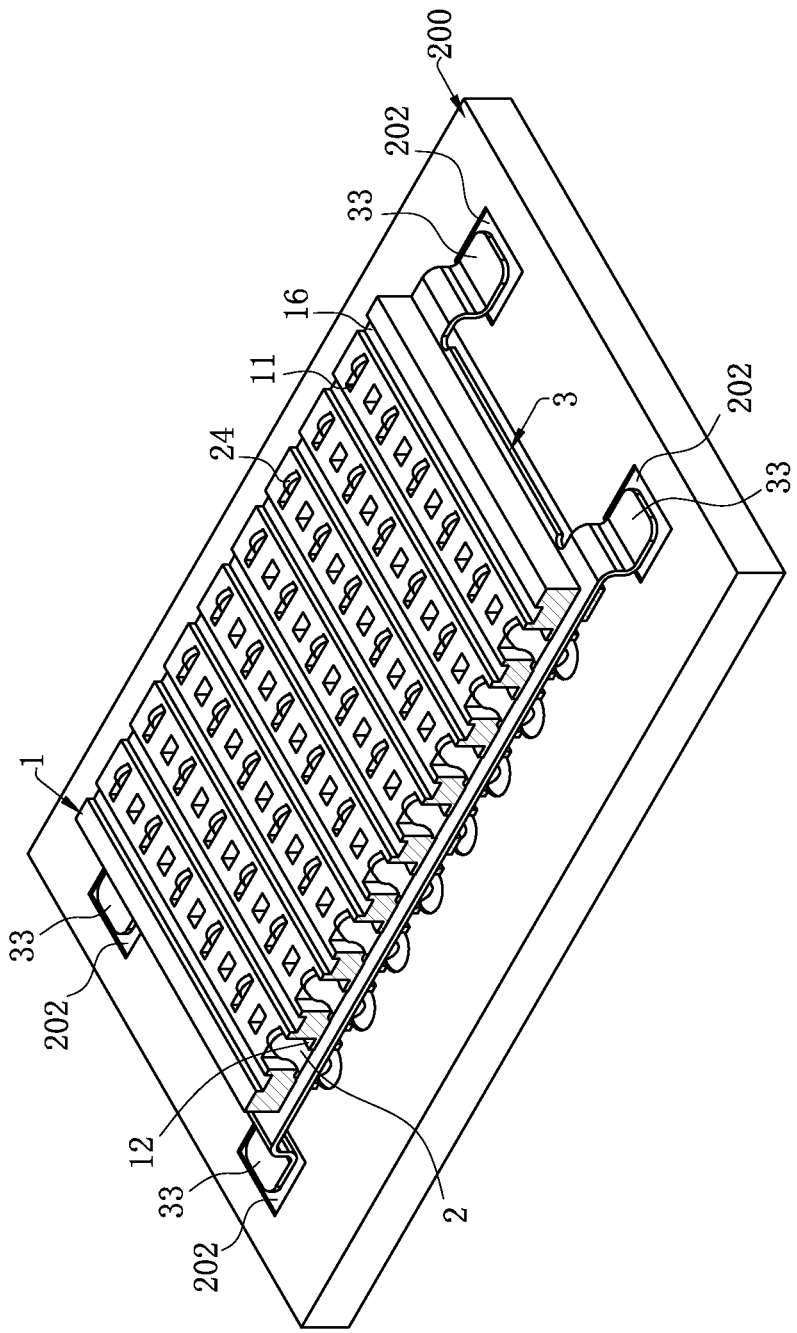
FIG. 8 is a schematic view of a fourth embodiment of the present invention.

FIG. 8 shows a fourth embodiment of the present invention. The difference of this embodiment from the third embodiment exists in that the first fixing portions 33 are both of an SMT type, the second fixing portions 202 are soldering pads on the circuit board 200, and the first fixing portions 33 are flatly attached to the second fixing portions 202.

Figure 9:
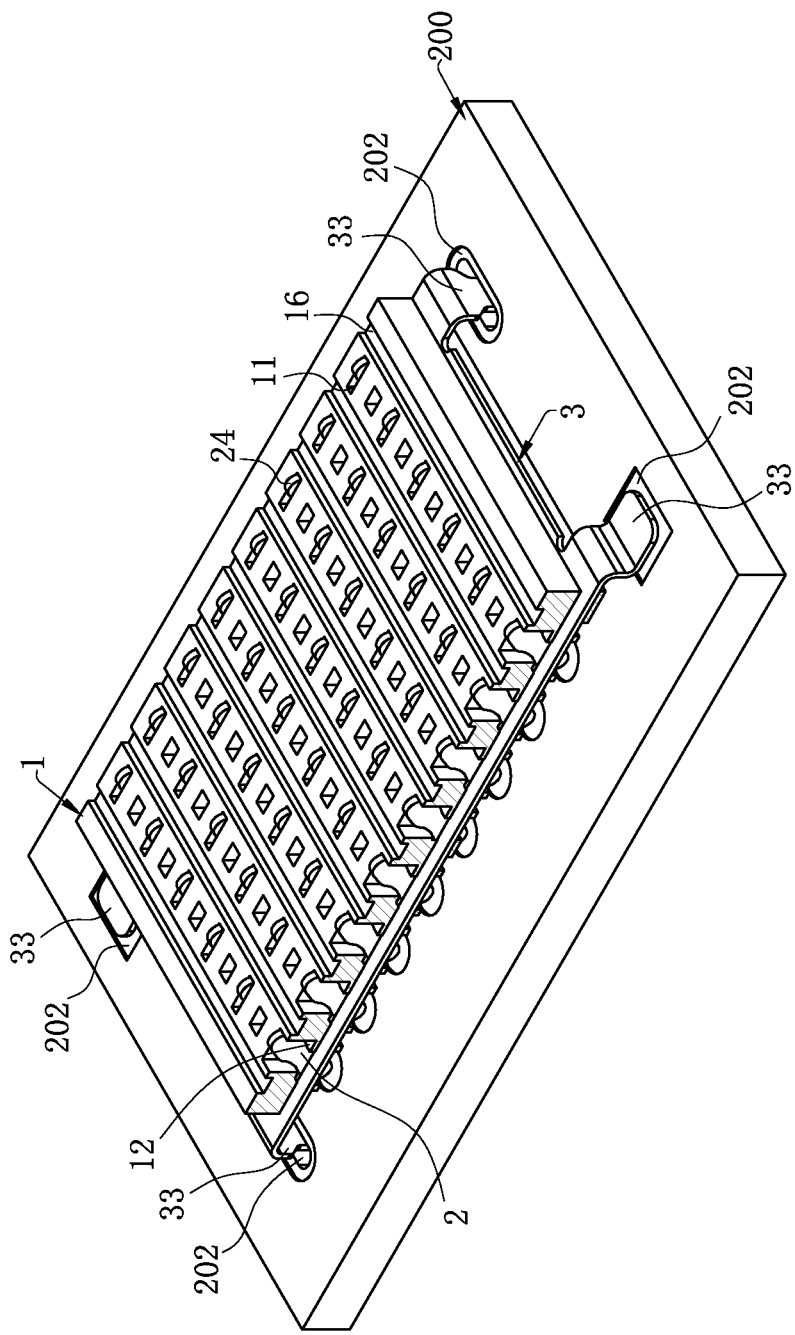
FIG. 9 is a schematic view of a fifth embodiment of the present invention.

FIG. 9 shows a fifth embodiment of the present invention. The differences of this embodiment from the fourth embodiment exist in that the two first fixing portions 33 located on the same side are of an SMT type and a DIP type respectively. Correspondingly, the two second fixing portions 202 located on the same side are a soldering pad on the circuit board 200 and an opening penetrating through the circuit board 200 vertically respectively. The first fixing portion 33 of the SMT type is flatly attached to the second fixing portion 202 in the shape of the soldering pad, and the first fixing portion 33 of the DIP type is inserted into the second fixing portion 202 in the shape of the opening.

Figure 3:
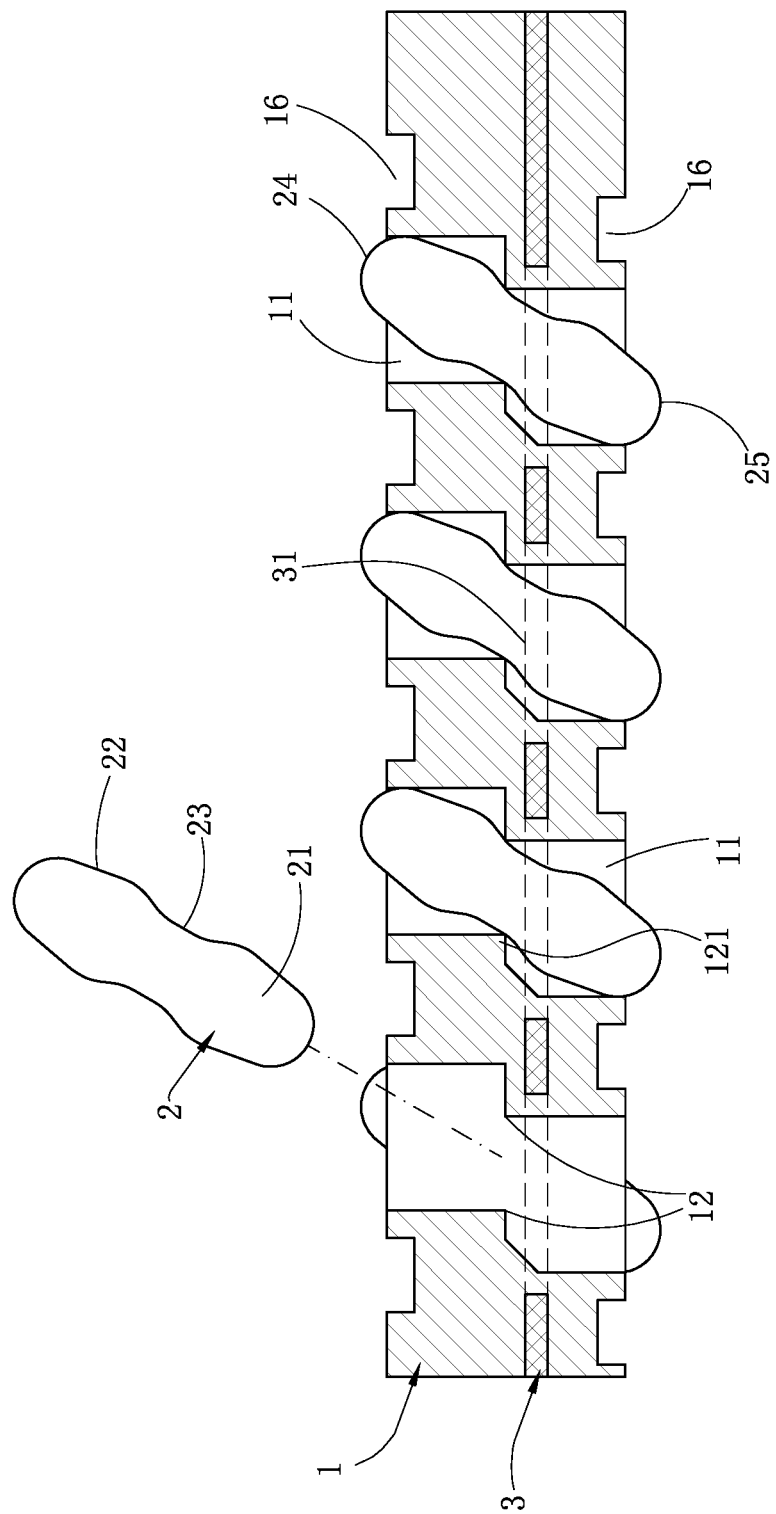
FIG. 3 is a front sectional view of the electrical connector according to the first embodiment of the present invention.

As shown in FIG. 1, FIG. 2 and FIG. 3, in the manufacturing process of the electrical connector, the reinforcing plate 3 made of a metal material is provided first. The penetrating holes 31 are perforated on the reinforcing plate 3, and the filling holes 32 are perforated among each row of the penetrating holes 31. Then, an insulating material is provided, and the reinforcing plate 3 is coated with the insulating material by injection molding so as to form the elastic insulating body 1. The insulating body 1 is filled with the insulating material corresponding to the filling holes 32. The insulating body 1 is provided with the terminal slots 11 corresponding to the penetrating holes 31, and two opposite sides of the inner wall of each terminal slot 11 are provided with the positioning structures 12. The four corners of the insulating body 1 are each provided with one positioning hole 13, and the positioning posts 14 are inserted into the positioning holes 13 and fixed. The metal terminals 2 are correspondingly mounted in the terminal slots 11 and positioned by the positioning structures 12, so that the metal terminals 2 cannot disengage from the terminal slots 11.

Compared with the related art, the electrical connector according to certain embodiments of the present invention has the following beneficial effects:

1. The reinforcing plate 3 is coated with the insulating material by injection molding so as to form the elastic insulating body 1, and by means of the reinforcing plate 3, the structure of the insulating body 1 is reinforced, the shrinkage of the insulating body 1 is controlled, and the size of the terminal slots 11 is limited, so that the metal terminals 2 can be kept at desired positions, and poor contact of the insulating body 1 caused by excessive shrinkage can be prevented.

2. When the chip module 100 presses the metal terminals 2 downward, the metal terminals 2 press the inner wall of each terminal slot 11. When the chip module 100 moves away from the metal terminals 2, the inner wall of each terminal slot 11 rebounds to restore the positions of the metal terminals 2. In this way, the elastic deformation of the metal terminals 2 can be replaced with the elastic deformation of the insulating body 1, so that the metal fatigue of the metal terminals 2 caused by frequent compressive deformation can be avoided. Further, the metal terminals 2 are high in strength and are less likely to be broken under the pressure of the chip module 100, so as to ensure the work stability of the electrical connector.

3. The expansion slits 16 are concavely formed on the upper surface and the lower surface of the insulating body 1. When the insulating body 1 is placed on a high-temperature furnace and soldered to the circuit board 200, a space exists for the insulating body 1 to stretch under thermal deformation can exist, so as to prevent warping of the insulating body 1.

4. The protruding portions 121 are provided at two opposite sides of the inner wall of each terminal slot 11 to prevent the metal terminals 2 from disengaging from the insulating body 1, and also serve as the pivot points for the rotation of the metal terminals 2 to ensure normal work of the electrical connector.

5. The reinforcing plate 3 is provided with the filling holes 32. When the reinforcing plate 3 is coated with the insulating material by injection molding, the insulating material can sufficiently enter the filling holes 32, so that the insulating body 1 and the reinforcing plate 3 can be firmly combined.

6. The four corners of the insulating body 1 are each provided with one positioning hole 13. The positioning posts 14 are inserted into the positioning holes 13 and fixed, and the positioning posts 14 can limit the displacement of the chip module 100 in the horizontal direction and position the chip module 100, so that contact points (not shown) on the chip module 100 can be correspondingly connected to the metal terminals 2 to ensure that the electrical connector can work properly. In addition, the post bodies 141 can limit the chip module 100 from moving downward excessively to damage the metal terminals 2, so as to ensure the normal use of the electrical connector.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector configured to be electrically connected to a chip module, comprising:
    a reinforcing plate penetratingly provided with at least one penetrating hole;
    an insulating body encapsulating the reinforcing plate by injection molding, and provided with at least one terminal slot corresponding to the at least one penetrating hole, wherein a positioning structure is provided in each of the at least one terminal slot, and the insulating body is made of an elastic insulating material; and
    at least one metal terminal mounted on the positioning structure, wherein:
        an included angle between a central axis of each of the at least one metal terminal and a lower surface of the insulating body is greater than 45 degrees;
        each of the at least one metal terminal has an upper contact portion exposed from an upper surface of the insulating body and a lower contact portion exposed from the lower surface of the insulating body; and
        when the upper contact portion of each of the at least one metal terminal is in electrical contact with the chip module and the lower contact portion of each of the at least one metal terminal is in electrical contact with a circuit board, each of the at least one metal terminal interferes with an inner wall of a corresponding one of the terminal slots;
    wherein two first fixing portions are provided on the reinforcing plate, and two second fixing portions are provided on the circuit board to correspond to the two first fixing portions, and wherein:
        both of the two first fixing portions are of a dual-in-line (DIP) type, the two second fixing portions are openings penetrating through the circuit board, and the first fixing portions are inserted into the second fixing portions; or
        both of the first fixing portions are of a surface mounted technology (SMT) type, the second fixing portions are soldering pads, and the first fixing portions are flatly attached to the second fixing portions; or
        one of the two first fixing portions is of the DIP type, and the other of the two first fixing portions is of the SMT type, the first fixing portion of the DIP type is inserted into one of the second fixing portions in a shape of an opening, and the first fixing portion of the SMT type is flatly attached to the other of the second fixing portions in a shape of a soldering pad.

2. The electrical connector according to claim 1, wherein each of the at least one metal terminal is provided with a matching portion formed by shrinking inwardly at a middle portion thereof, and the matching portion matches with the positioning structure.

3. The electrical connector according to claim 1, wherein the positioning structure comprises a pair of protruding portions, and each pair of the protruding portions are staggered in a vertical direction.

4. The electrical connector according to claim 1, wherein the reinforcing plate has a plurality of penetrating holes, at least one filling hole is provided between two adjacent penetrating holes of the penetrating holes, and the at least one filling hole is filled with the elastic insulating material.

5. The electrical connector according to claim 4, wherein each of the at least one filling hole is smaller than each of the penetrating holes.

6. The electrical connector according to claim 1, wherein the elastic insulating material is silicon rubber.

7. The electrical connector according to claim 1, wherein at least one positioning hole is penetratingly provided around the insulating body, the circuit board is provided with a through hole corresponding to the at least one positioning hole, and a positioning post passes through the at least one positioning hole and extends into the through hole.

8. The electrical connector according to claim 1, wherein each of the at least one metal terminal is sheet-shaped, and each of the at least one metal terminal has a plate surface and a side edge.

9. The electrical connector according to claim 8, wherein the side edge presses the positioning structure and the inner wall of the corresponding terminal slot.

10. The electrical connector according to claim 8, wherein the plate surface presses the positioning structure and the inner wall of the corresponding terminal slot.

11. The electrical connector according to claim 1, wherein when the chip module is operated to press the at least one metal terminal downward, the positioning structure and the inner walls of the terminal slots deform, and when the chip module is operated to move away from the at least one metal terminal, the positioning structure and the inner walls of the terminal slots rebound to restore positions of the at least one metal terminal.

12. The electrical connector according to claim 1, wherein at least one expansion slit is concavely formed on the upper surface and the lower surface of the insulating body.

13. The electrical connector according to claim 1, wherein at least one of the two first fixing portions is provided on at least one side of the reinforcing plate, and the two first fixing portions are correspondingly positioned on the two second fixing portions.

* * * * *